United States Patent [19]

Kumomi

[11] Patent Number: 5,207,863
[45] Date of Patent: May 4, 1993

[54] CRYSTAL GROWTH METHOD AND CRYSTALLINE ARTICLE OBTAINED BY SAID METHOD

[75] Inventor: Hideya Kumomi, Tokyo, Japan

[73] Assignee: Canon Kabushiki Kaisha, Tokyo, Japan

[21] Appl. No.: 680,528

[22] Filed: Apr. 4, 1991

[30] Foreign Application Priority Data

Apr. 6, 1990 [JP] Japan .................................. 2-91655
Apr. 7, 1990 [JP] Japan .................................. 2-92478

[51] Int. Cl.$^5$ .......................................... C30B 25/00
[52] U.S. Cl. ................................ 156/603; 148/562; 156/612; 156/613; 156/614; 156/DIG. 111; 437/11; 437/89; 437/100; 437/173
[58] Field of Search .............. 148/154; 156/603, 612, 156/613, 614, DIG. 111; 437/11, 89, 101, 173

[56] References Cited

U.S. PATENT DOCUMENTS

| | | | |
|---|---|---|---|
| 3,585,008 | 6/1971 | Schwuttke et al. | 156/603 |
| 3,830,668 | 8/1974 | Dearnaley et al. | 437/11 |
| 3,976,512 | 8/1976 | DeNora et al. | 437/11 |
| 4,378,629 | 4/1983 | Bozler et al. | 156/612 |
| 4,383,883 | 5/1983 | Mizutani | 156/603 |
| 4,565,584 | 1/1986 | Tamura et al. | 437/101 |
| 4,693,759 | 9/1987 | Noguchi et al. | 437/24 |

FOREIGN PATENT DOCUMENTS 0307108 3/1989 European Pat. Off. ..
0308166 3/1989 European Pat. Off. ..
58-56406 4/1983 Japan .
63-253616 10/1988 Japan .

OTHER PUBLICATIONS

Patent Abstracts of Japan, vol. 10, No. 58 (E-386) [2115] (Mar. 7, 1986) and JP-60211822.
T. Noguchi, et al. "Polysilicon Super Thin Film Transistor Technology," Materials Research Society Symposium Proceedings, vol. 106, Polysilicon and Interfaces, pp. 293-304 (1988).

*Primary Examiner*—Robert Kunemund
*Assistant Examiner*—Felisa Garrett
*Attorney, Agent, or Firm*—Fitzpatrick, Cella, Harper & Scinto

[57] ABSTRACT

A crystal growth method for crystallizing an amorphous thin film comprises heat-treating an amorphous thin film having a region (I) with a predetermined film thickness and a region (II) with a larger film thickness than the region (I) and having a sufficiently small area so as to form only a single nucleus from which a single crystal is grown by solid phase growth at a temperature not higher than the melting point of the film.

17 Claims, 4 Drawing Sheets

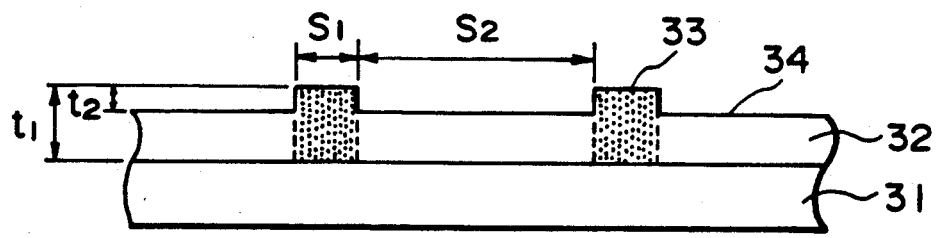
F I G. 3A
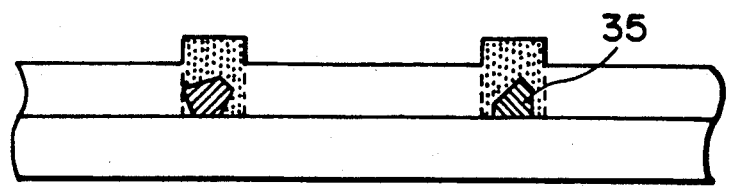
F I G. 3B
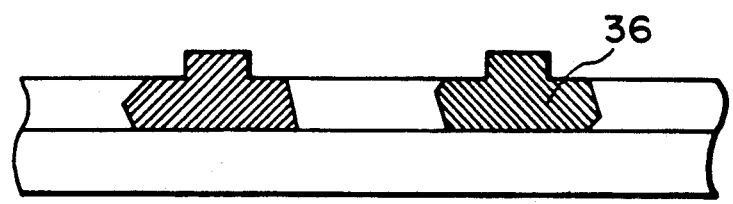
F I G. 3C
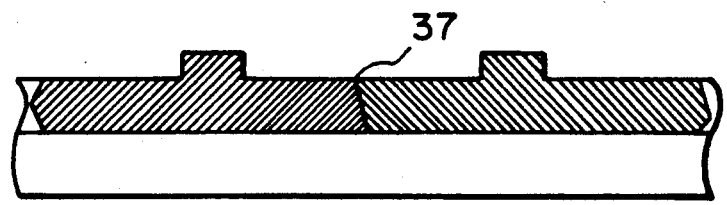
F I G. 3D

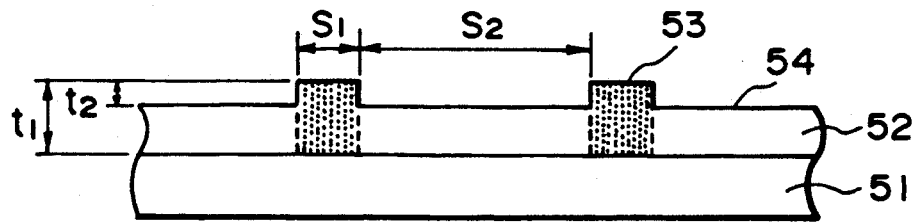
F I G. 5A
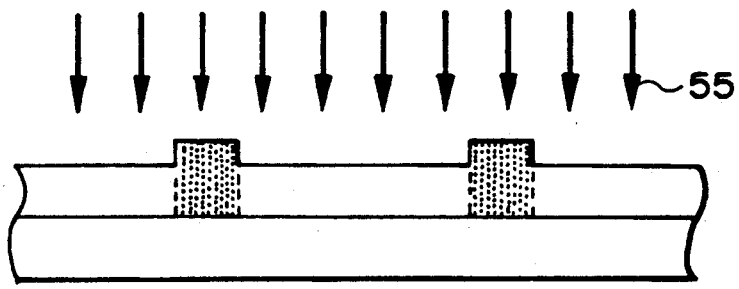
F I G. 5B
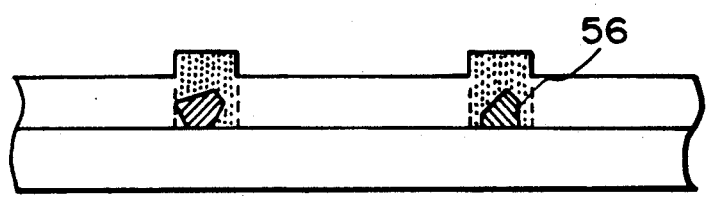
F I G. 5C
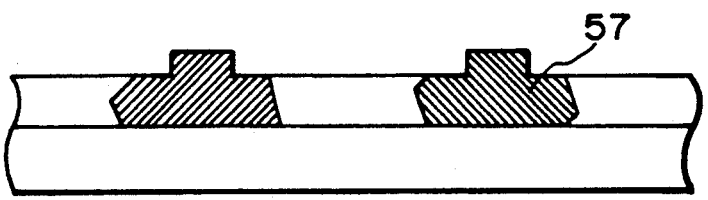
F I G. 5D
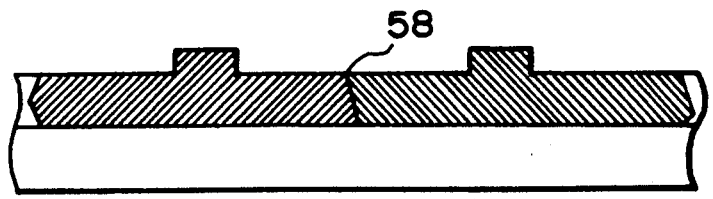
F I G. 5E

CRYSTAL GROWTH METHOD AND CRYSTALLINE ARTICLE OBTAINED BY SAID METHOD

BACKGROUND OF THE INVENTION

1. Field of the Invention

This invention relates to a thin film crystal and a method for forming the same, particularly to a thin film crystal which is formed at a relatively lower temperature by controlling nucleation formation positions of a plurality of thin film crystal grains, and is controlled in the positions of the grain boundaries formed at the portion where adjoining crystal grains contact each other, and the sizes of the crystal grains, and can be applied to a thin film crystal to be utilized for, for example, electronic devices such as semiconductor devices, etc., optical devices, etc., and to a method for forming the same.

2. Related Background Art

As a method in the field of crystal formation technique which grow a crystalline thin film on a substrate such as amorphous substrate, etc., there has been proposed the method in which an amorphous thin film previously formed on a substrate is permitted to grow in solid phase by annealing at a low temperature not higher than the melting point. For example, there has been reported a method for forming a crystal that by annealing an amorphous Si thin film with a film thickness of about 100 nm formed on an amorphous $SiO_2$ surface in an $N_2$ atmosphere at 600° C., the above amorphous Si thin film is crystallized to become a polycrystalline thin film with the maximum grain size of about 5 μm [T. Noguchi, H. Hayashi and H. Oshima, 1987, Mat. Res. Soc. Symp. Proc., 106, Polysilicon and Interfaces 293 (Elaevier Science Publishing, New York, 1988)]. The surface of the polycrystalline thin film obtained according to this method remains flat, and therefore it can be used as such for formation of an electronic device such as MOS transistor or diode. Also, those devices obtained have relatively higher performances, because the average grain size of the polycrystal is by far greater as compared with conventional polycrystalline silicon, etc. deposited according to LPCVD method.

However, in this crystal formation method, although the crystal size is large, its distribution and the positions of the crystal grain boundaries are not controlled. For, in this case, since the crystallization of the amorphous material is based on solid phase epitaxial growth of the crystal nuclei generated randomly in the amorphous material by annealing, the position of the grain boundaries are also randomly formed, with the result that the grain sizes are distributed over a wide range. Therefore, the following problems arise by merely large average grain size of crystal grains. For example, in an MOS transistor, the size of the gate is similar to the crystal grain size, or lower than that, and therefore no grain boundary is included in the gate portion, or several grain boundaries are included. In the region where no boundary or only one or two grain boundaries are included, electric characteristics will vary greatly. For this reason, a great variance will occur in the characteristics between a plurality of devices, thereby posing remarkable obstacles in forming integrated circuits, etc.

Among the problems of the polycrystalline thin film of large grain size by solid phase crystallization as mentioned above, a method of suppressing variance of grain sizes has been proposed in, for example, Japanese Laid-open Patent Application No. 58-56406. That method is described by referring to FIGS. 1A and 1B. First, as shown in FIG. 1A, on the surface of an amorphous Si thin film 2 formed on the amorphous substrate 1, a thin film small strip 3 comprising another material is provided periodically, and the whole substrate is annealed in a conventional heating oven. Then, in the amorphous Si thin film 2, nucleation of a crystal nucleus 4 will occur preferentially from the site in contact with the peripheral side of the thin film small strip 3. Accordingly, when the crystal nucleus is further grown, the amorphous Si thin film 2 is crystallized over the whole region, whereby a polycrystalline thin film comprising a group of crystalline grains 5 with large grain sizes shown in FIG. 1B is obtained. According to Japanese Laid-open Patent Application No. 58-56406, it is stated that the variance of grain sizes can be reduced by this method to about ¼ as compared with the prior art method previously shown.

However, yet considering the practical level, it cannot be said to be satisfactory in some cases. For example, when the thin film small strips 3 are arranged in lattice points with intervals of 10 μm, the variance of grain sizes can be restricted within the range of about 3 to 8 μm, but such level cannot be said to be satisfactory in most cases. Particularly, as to control of the positions of crystal boundaries, they are not controlled almost at all under the present situation. The reason is that preferential nucleation occurs at the peripheral sides of the thin film small strips 3 due to the localization effect of the elastic energy at the portions where amorphous Si thin film 2 contacts the peripheral side portions of the thin film small strips 3, whereby not only a plurality of nuclei are generated along the peripheral side, but also its number can be controlled with difficulty.

Concerning the method for controlling the nucleation positions in solid phase growth of amorphous Si thin film, other method is proposed, for example, in Japanese Laid-open Patent Application No. 63-253616. This is the method as shown in FIG. 2 in which a region 24 in which a substance 23 other than Si is locally ion-implanted into the amorphous Si thin film 22, to generate crystal nuclei preferentially there. As the substance 23 other than Si, N is proposed, and in that case, actually selectivity concerning nucleation between the region 24 ion-implanted and other regions 25 cannot be said to be necessarily satisfactory, and there has been no report about practical realization of this method to full satisfaction on practical level.

SUMMARY OF THE INVENTION

The present invention has been accomplished in view of the problems as mentioned above, and its object is to provide a crystal growth method which enables selective nucleation of a single crystal nucleus in solid phase growth in an amorphous thin film which selective nucleation could be practically realized with difficulty by the method of the prior art, at high yield and also low cost, and a crystalline article by use of the method.

Another object of the present invention is to provide a crystal growth method which enables to obtain a thin film crystal comprising a group of crystal grains which is flat, and controlled in the grain boundary positions with adjoining crystal grains and grain sizes under the state grown as such without requiring any step such as polishing, etc. or, even when used, by simple polishing, and which also enables to form various devices of high performances with little variance, and a crystalline article or crystalline thin film by use of said method.

Still another object of the present invention is to provide a crystal growth method for crystallizing an amorphous thin film, which comprises heat-treating an amorphous thin film having a region (I) with a predetermined film thickness and a region (II) with a larger film thickness than the region (I) and a sufficiently small area so as to form only a single nucleus from which a single crystal is grown by solid phase growth, at a temperature not higher than the melting point of the film, and a crystalline article obtained by use of said method.

Still another object of the present invention is to provide a crystal growth method for crystallizing an amorphous thin film, which comprises implanting ions into an amorphous thin film having a region (I) with a predetermined film thickness and a region (II) with a larger film thickness than the region (I) and a sufficiently small area so as to form only a single nucleus from which a single crystal is grown by solid phase growth, and heat-treating the ion-implanted amorphous thin film at a temperature not higher than the melting point of the film and a crystalline article obtained by use of said method.

BRIEF DESCRIPTION OF THE DRAWINGS

FIGS. 3A to 3D are each schematic sectional view showing one preferable method for forming the crystalline thin film according to the present invention.

FIGS. 5A to 5E are schematic sectional views for illustration of another preferable example of the steps of the method for forming the crystalline thin film according to the present invention.

DESCRIPTION OF THE PREFERRED EMBODIMENTS

Figure 1A:
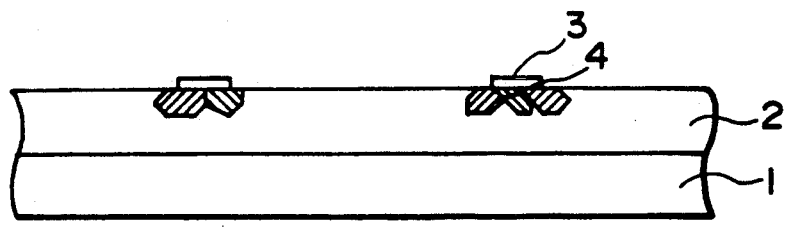
FIGS. 1A, 1B and 2 are each schematic sectional view for illustration of one step in the method for forming a thin film crystal.
Figure 1B:
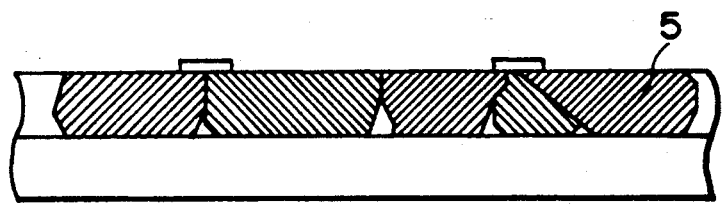
Figure 2:
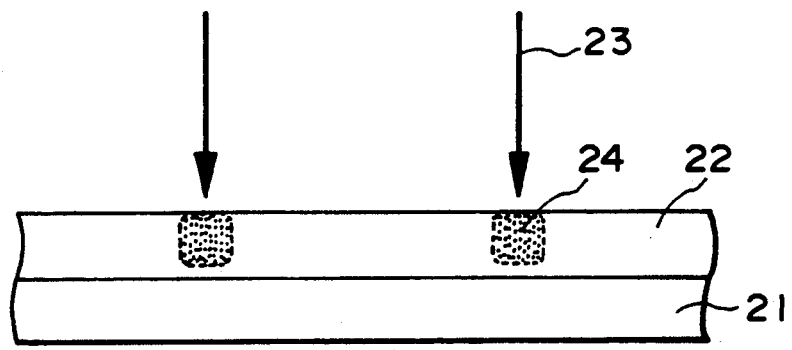

To explain briefly, according to the present invention, by utilizing the fact that the crystal nucleation process in the amorphous thin film depends on the film thickness of the amorphous thin film, by subjecting an amorphous thin film having regions with different film thicknesses formed within a plane to heat treatment at a temperature not higher than the melting point of the film, a single crystal nucleus is preferentially formed artificially only at the specific position within a plane, and further permitting it to be epitaxially grown in the solid phase in the lateral direction. It enables to form a thin film crystal which is flat as grown without requiring any step such as polishing, etc. and also consists of a group of crystal grains controlled in the boundary grain positions between the adjoining crystal grains and grains sizes.

Also, according to the present invention, by utilizing the fact that the crystal nucleation process in the amorphous thin film depends on the implantation energy in ion-implantation into the amorphous thin film, by subjecting an amorphous thin film having regions with different film thicknesses formed within a plane to heat treatment at a temperature not higher than the melting point of the film, a single crystal nucleus is preferentially formed artificially only at the specific position within the plane, and further permitting it to be epitaxially grown in the solid phase in the lateral direction. It enables to form a thin film crystal which is flat as grown without requiring any step such as polishing, etc. and also consisting of a group of crystal grains controlled in the boundary grain positions between the adjoining crystal grains and grains sizes.

In the following, the principle of the method for forming a thin film crystal according to the present invention is described in detail.

Generally, when an amorphous thin film formed on a subbing substrate having an amorphous surface is recrystallized in the solid phase as such by heat treatment at a temperature not higher than the melting point of the film, it has been known that nucleation of a crystal nucleus which becomes the starting point of crystallization is liable to occur in the surface vicinity of the interface between the subbing substrate and the amorphous thin film. This may be considered to be caused by the fact that while nucleation in the film is "homogeneous nucleation", nucleation at the interface is "heterogeneous nucleation", and the activation energy of the latter is lower than that of the former. Therefore, when the film thickness of the amorphous thin film is sufficiently small relative to the growth rate of the crystal grain after nucleation and the nucleation rate in the film, the crystal grain nucleated at the interfaces reaches immediately the thin film surface through the growth of its own, and thereafter grows only in the lateral direction within the plane of the thin film, whereby the rate of such crystallization step is controlled by nucleation at the interface.

Figure 4:
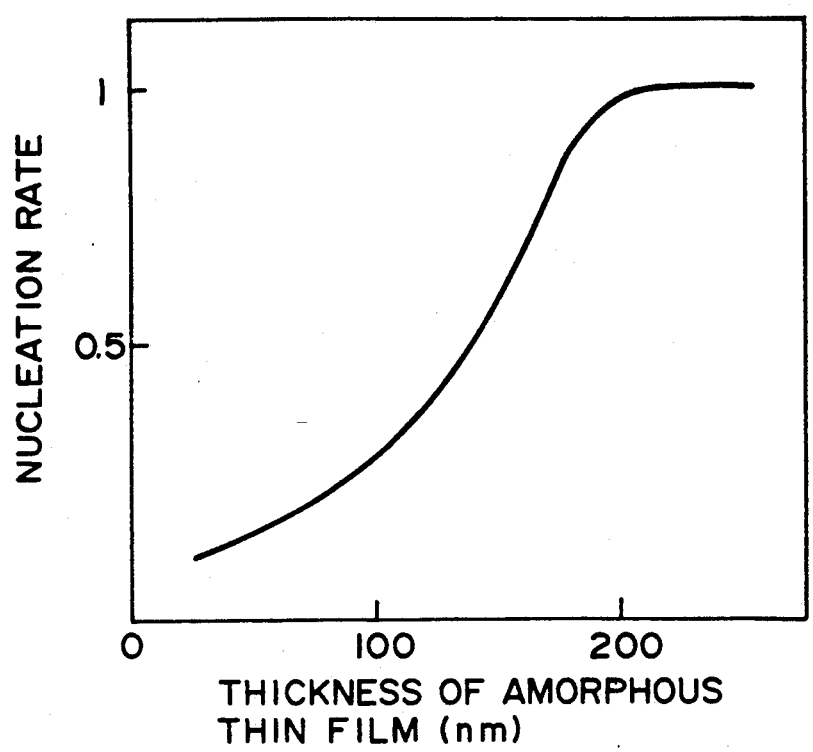
FIG. 4 illustrates the method for forming a thin film crystal according to the present invention, and is a graph for illustration of the tendency of dependence of nucleation rate on the film thickness of amorphous thin film in the solid phase recrystallization process of amorphous thin film.

Accordingly, samples with different film thicknesses for amorphous thin films of some materials are prepared, and heat treatments were applied thereon for examination of the crystallization process of crystal nucleus. As the result, it was found that the incubation time before formation of the first nucleation after initiation of the heat treatment and the nucleation rate at the initial stage of heat treatment depend strongly on the film thickness. FIG. 4 is a graph showing the tendency of dependence of the nucleation rate on the film thickness of the amorphous thin film. The nucleation rate increases exponentially with increase in film thickness up to a certain range. The nucleation rate, after increased exponentially, is saturated. FIG. 4 shows the relationship of the nucleation rate relative to the film thickness in terms of relative ratio to the saturated value. Generally, the incubation time of nucleation tends to be shortened with increase in film thickness. These two phenomena independent in principle, and their mechanisms have not yet been clarified, but it would be certain that "nucleation will readily occur as the film thickness is larger". Therefore, by selecting contrariwise the film thickness, nucleation can be controlled easily.

Figure 6:
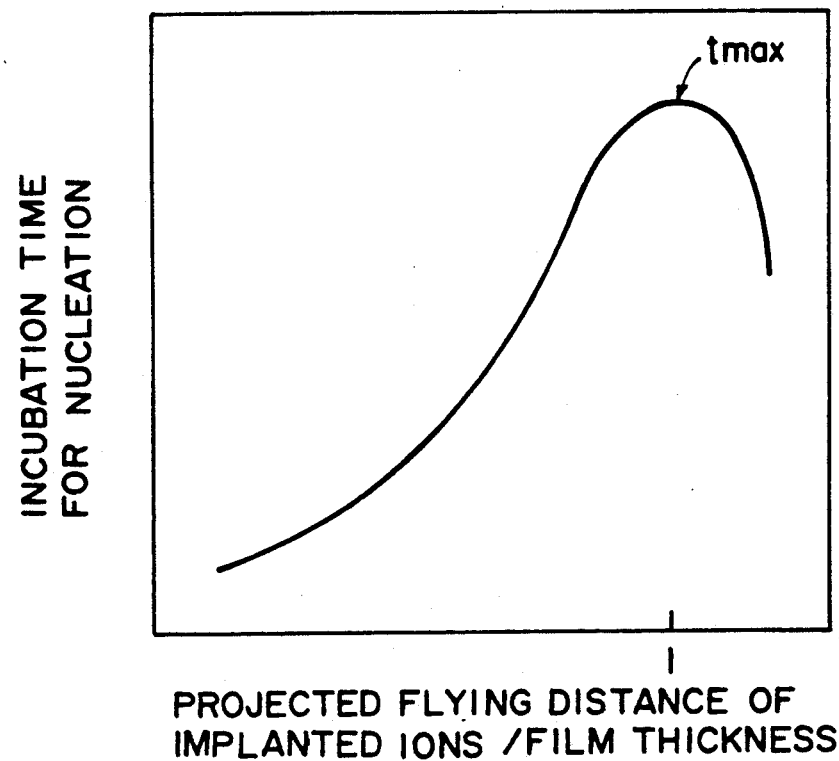
FIG. 6 illustrates the method for forming a thin film crystal according to the present invention, and is a graph for illustration of the tendency of dependence of the incubation time for nucleation on the film thickness of the amorphous thin film and the projected flying distance of implanted ions in the solid phase recrystallization process of the amorphous thin film.

Also, for amorphous thin films of some materials, before the heat treatment step, ions of the constituent substance were implanted followed by application of the heat treatment and the crystallization process of the crystal nuclei was examined. As the result, it was found that the incubation time before occurrence of initial nucleation after initiation of the heat treatment became sensible by ion-implantation off the constituent substance. And, it was also found that the incubation time varied depending on the implantation energy and the dose of ion-implantation. FIG. 6 shows the tendency of the dependency of the incubation time on the projected flying distance of ions in the amorphous thin film which was varied by implantation energy. The incubation time of nucleation exhibited the maximum where the projected flying distance of ion-implantation was equal to the film thickness, namely, in the vicinity of the interface between the amorphous thin film and the substrate. This result is due to the fact that nucleation of the crystal nuclei formed at the initial stage in the vicinity of the interface as described above is controlled by ion-implantation of the constituent substance of the amorphous thin film.

The method for forming the thin film crystal according to the present invention utilizes the findings as described above. The formation processes are described by referring to FIGS. 3A to 3D as embodiments.

First, on a subbing substrate 31 having an amorphous surface, an amorphous thin film 32 comprising a predetermined material is provided so that a region (I) 34 with a predetermined film thickness and a region (II) 33 with a larger thickness than the region (I) 34 and having a sufficiently small area so as to form only a single nucleus from which a single crystal is grown by solid phase growth may coexist within a plane [FIG. 3A]. However, the difference in film thickness between the region (II) 33 and the region (I) 34 or the ratio thereof should be set so that sufficient difference is obtained for easy nucleation in two regions in the subsequent heat treatment step.

The film thickness $t_1$ of the amorphous thin film 32 is preferably 10 to 1000 nm, more preferably 20 to 500 nm, optimally 50 to 300 nm.

The difference $t_2$ in film thickness between the region (II) 33 and the region (I) 34 is preferably 1 to 500 nm, more preferably 5 to 300 nm, optimally 10 to 100 nm.

The area $S_2$ of the region (I) 34, as represented by the diameter or the intercentral distance of the region (II) 33, is preferably 100 $\mu$m or less, more preferably 20 $\mu$m or less, optimally 10 $\mu$m or less.

The area $S_1$ of the region (II) 33, as represented by the diameter or the shorter side (e.g., of a square shape), is preferably 0.1 to 5000 nm, more preferably 1 to 2000 nm, optimally 30 to 1000 nm.

Accordingly, if this is heat-treated at an adequate temperature, nucleation occurs preferentially in the region 33 [FIG. 3B]. Here, if the area of the region (II) 33 is sufficiently small, optimized relative to the nucleation rate, it is possible to generate only one nucleus selectively.

The nucleus 35 generated in the region (II) 33 [FIG. 3B] grows by further heat treatment beyond the region (II) 33 to the region (I) 34 to become a crystal grain 36 [FIG. 3C]. On the other hand, if the incubation time for nucleation in the region (I) 34 is sufficiently long, the crystal grain 36 continues to grow laterally without any interference at all during that time, until it contacts the crystal grain 36' grown similarly from the adjacent region 33' at the growth end surface to form a grain boundary 37 [FIG. 3D]. Thus, a thin film crystal consisting of a group of crystal grains with large sizes controlled in boundary positions and grain sizes can be obtained.

The heat treatment temperature may be preferably not higher than the melting point of the material (Tm: Kelvin temperature), more preferably 0.25 Tm to 0.8 Tm, optimally 0.4 Tm to 0.5 Tm.

As the crystal material, for example, semiconductors such as Si, Ge, GaAs, InP, etc., metals such as Al, Mo, etc. can be employed.

As the subbing materials, for example, non-monocrystalline insulating materials such as $SiO_2$, $Si_3N_4$, $Al_2O_3$, etc. may be employed.

Crystallization of the amorphous thin film according to the present invention described by referring to FIGS. 3A to 3D may be effected on either the whole surface of the thin film or a part thereof.

As the heating means in the present invention, any heating means which obtain a desired heating can be used, but heat generation with a resistor, IR radiation, etc. or high energy radiation (or action) such as laser, etc. may be suitably used.

Another method for forming the thin film crystal according to the present invention similarly utilizes the findings as described above. The formation processes are described by referring to FIGS. 5A to 5E as embodiments.

First, on a subbing substrate 51 having an amorphous surface, an amorphous thin film 52 comprising a predetermined material is provided so that a region (I) 54 with a predetermined film thickness and a region (II) 53 with a larger thickness than the region (I) 54 and having a sufficiently small area so as to form only a single nucleus from which a single crystal by solid phase growth may co-exist within a plane [FIG. 5A]. However, the film thickness of the respective regions should be set so that a sufficient difference in incubation time mutually is obtained between the respective regions for the acceleration energy in the next ion-implantation.

Also in this case, the film thickness $t_1$ of the amorphous thin film 52 is preferably 10 to 1000 nm, more preferably 20 to 500 nm, optimally 50 to 300 nm.

The difference $t_2$ in film thickness between the region (II) 53 and the region (I) 54 is preferably 1 to 500 nm, more preferably 5 to 300 nm, optimally 10 to 100 nm.

The area $S_2$ of the region (I) 54, as represented by the diameter or the intercentral distance of the region (II) 53, is preferably 100 $\mu$m or less, more preferably 20 $\mu$m or less, optimally 10 $\mu$m or less.

The area $S_1$ of the region (II) 53, as represented by the diameter or the shorter side (e.g., shorter side of a square shape) is preferably 0.1 to 5000 nm, more preferably 1 to 2000 nm, optimally 30 to 1000 nm.

Next, ions 55 are implanted into the whole surface of the amorphous thin film 52 [FIG. 5B]. At this time, the acceleration energy of implanted ions should be desirably set so that nucleation in the vicinity of the interface between the region (I) 54 with a predetermined film thickness and the subbing layer 51 should be sufficiently suppressed, for example, its projected flying distance may be just equal to the film thickness of the region (I) 54. Then, in the region (II) 53 with a larger film thickness, the projected flying distance of implanted ions exists at a position shallower than the interface with the subbing substrate 51, whereby as described above, the incubation time of nucleation becomes shorter than in the region (I) 54. This is the point of the ion-implanted step greatly different from the previous embodiment.

Accordingly, if this is heat-treated at a lower temperature than the melting point of the amorphous thin film 52, a crystal nucleus 56 is generated preferentially in the vicinity of the interface between the region (II) 53 with a larger film thickness and the subbing substrate 51 [FIG. 5C]. Here, if the ion-implantation conditions, the film thickness and area of the region (II) 53 are adequate for the heat treatment temperature, it is possible to generate only one nucleus 56 selectively.

On the other hand, if the incubation time for nucleation in the region (I) 54 is sufficiently long, during that period the crystal nucleus 56 grows laterally beyond the region (II) 53 with a larger film thickness to the region (I) 54, to become a crystal grain 57 [FIG. 5D]. And, at last, it contacts the crystal grain 57' grown similarly from the adjacent region (II) 53' at the growth end surface to form a grain boundary 58 [FIG. 5E]. Thus, a thin film crystal consisting of a group of crystal grains with large sizes controlled in boundary positions and grain sizes can be obtained.

In the method for forming a thin film crystal according to the present invention as explained by referring to FIGS. 5A to 5E, instead of providing the amorphous thin film 52 on the surface of the subbing substrate 51 from the beginning, it is also possible to deposit a polycrystalline thin film and making it amorphous at the same time during ion-implantation.

The heat treatment temperature, also in this case, may be preferably not higher than the melting point of the material (Tm: Kelvin temperature), more preferably 0.25 Tm to 0.8 Tm, optimally 0.4 Tm to 0.5 Tm.

As the crystal material, for example, semiconductors such as Si, Ge, GaAs, InP, etc., and metals such as Al, Mo, etc. can be employed.

As the subbing material, for example, non-monocrystalline insulating materials such as $SiO_2$, $Si_3N_4$, $Al_2O_3$, etc. may be employed.

The implanted ion species may be preferably the constituent element of the crystal material, and the implantation conditions may be suitable determined depending on the crystal material and the implanted ion species.

Crystallization of the amorphous thin film according to the present invention explained by referring to FIG. 5 may be effected on either the whole surface of the thin film or a part thereof.

The heating means, etc. may be the same as previously described.

In the following, preferable Examples in which the method for forming a thin film crystal according to the present invention is applied to the formation of an Si thin film crystal according to the steps shown in the embodiments.

EXAMPLE 1

By use of a molten quartz substrate, an amorphous Si thin film was deposited with a film thickness of 150 nm on its surface according to the low pressure CVD method.

And, for inhibiting nucleation at the interface between the thin film deposited as such and the quartz substrate to some extent, $Si^+$ ions accelerated to an energy of 100 keV were implanted into the whole surface at a dose of $1 \times 10^{15}$ ions.cm$^{-2}$.

Next, on the amorphous Si thin film was coated a resist with a film thickness of about 1 μm, and this was subjected to etching according to conventional photolithographic steps so that regions each of 1 μm square might remain in lattice spots with intervals of 5 μm.

And, the Si thin film in the region not masked with the resist was subjected to etching of about 50 nm according to the RIE method. By the etching, the region masked with the resist has a film thickness of 150 nm, while the region subjected to etching has a film thickness of 100 nm.

Accordingly, after the resist was peeled off, the film was heat-treated at a substrate temperature maintained at 590° C. in an $N_2$ atmosphere. Then, after about 5 hours from initiation of the heat treatment, a crystal nucleus began to generate at the region of 1 μm square with a larger film thickness. At this point, since no nucleation occurred in the surrounding region having a small film thickness, annealing was further continued, whereby the crystal nucleus already formed in the region of 1 μm square grew in the lateral direction beyond that region to become a dendrical thin film crystal of a large grain size. And, when heat treatment was applied for about 30 hours, the crystal contracted with the crystal grain grown from the adjoining region about 5 μm apart therefrom to form a grain boundary with their growth end surface, thereby the amorphous Si thin film was crystallized over substantially the all region. As the result, while arranging the crystal grain boundaries in lattices with intervals of ca. 5 μm, a thin film crystal comprising a group of crystal grains with an average grain size of 5 μm was obtained.

EXAMPLE 2

By using for this time an Si substrate having a thermally oxidized film on the surface a polycrystalline Si thin film was deposited on its surface with a film thickness of 100 nm according to the low pressure CVD method.

And, the polycrystalline thin film was made amorphous, and further for inhibiting nucleation at the oxidized film interface, $Si^+$ ions accelerated to an energy of 70 keV were implanted into the whole surface at a dose of $5 \times 10^{15}$ ions.cm$^{-2}$.

Next, on the Si thin film made amorphous was coated a resist with a film thickness of about 1 μm, and the resist was subjected to patterning according to conventional photolithographic steps so that regions of 2 μm square might remain in lattice spots with 10 μm intervals.

And, the Si thin film in the region not masked with the resist was subjected to etching of about 25 nm according to the RIE method. By doing so, the region masked with the resist becomes to have a film thickness of 100 nm, while the region subjected to etching a film thickness of 75 nm.

Accordingly, after the resist was peeled off, the film was subjected to heat treatment at a substrate temperature maintained at 600° C. in an $N^2$ atomosphere. Then, after about 10 hours from initiation of the heat treatment, a crystal nucleus began to be generated in the region of 2 μm square with a larger film thickness. At this point, since no nucleation occurred in the surrounding region having a small film thickness, heat treatment was further continued, whereby the crystal nucleus already formed in the region of 2 μm square grew in the lateral direction over that region to become a dendrical thin film crystal of a large grain size. And, when heat treatment was continued for 80 hours, the crystal contacted with the crystal grain grown from the adjoining region about 10 μm apart therefrom to form a grain boundary with the growth end surfaces, and the amorphous Si thin film crystallized over substantially the whole region. As the result, a thin film crystal comprising a group of crystal grains with an average grain size of 10 μm was obtained, while arranging the crystal grain boundaries in lattices with approximately 10 μm intervals.

When, transistors were formed by use of the thin film crystals obtained in Examples 1 and 2, the transistor characteristics in both cases were free from substantial difference between the respective transistors, thus exhibiting good characteristics.

Also, as different from the polycrystalline thin film of the prior art, the crystal positions can be controlled in both cases, whereby no grain boundary was positioned at the channel portion of the transistor, and the characteristics of the transistor could be satisfied over the whole substrate.

EXAMPLE 3

By use of a molten quartz substrate, an amorphous Si thin film was deposited with a film thickness of 150 nm on its surface according to the low pressure CVD method.

Next, on the amorphous Si thin film was coated a resist with a film thickness of about 1 μm, and this was subjected to patterning according to conventional photolithographic steps so that regions of 1 μm square might remain in lattice spots with intervals of 5 μm.

And, the Si thin film in the region not masked with the resist was subjected to etching of about 50 nm according to the RIE method. By the etching, the region masked with the resist has a film thickness of 150 nm, while the region subjected to etching has a film thickness of 100 nm.

Next, after the resist was peeled off, $Si^+$ ions accelerated to an energy of 70 keV were implanted at a dose of $1 \times 10^{15}$ ions.cm$^{-2}$ into the whole thin film. In this case, since the projected flying distance is 99.7 nm, the ions are positioned approximately at the interface with the quartz substrate in the region made thinner by etching, but they will be distributed at the position shallower by about 50 nm than the interface in the region which was left to remain thick as such.

Accordingly, the film was heat-treated at a substrate temperature maintained at 590° C. in an $N_2$ atmosphere. Then, after about 10 hours from initiation of the heat treatment, a crystal nucleus began to be generated at the region of 1 μm square with a larger film thickness. At this point, since no nucleation occurred in the surrounding region having a small film thickness, heat treatment was further continued, whereby the crystal nucleus already formed in the region of 1 μm square grew in the lateral direction beyond that region to become a dendrical thin film crystal of a large grain size. And, when heat treatment was applied for about 50 hours, the crystal contacted with the crystal grain grown from the adjoining region about 5 μm apart therefrom to form a grain boundary with their growth end surface, until the amorphous Si thin film was crystallized over substantially the all region. As the result, while arranging the crystal grain boundaries in lattices with intervals of ca. 5 μm, a thin film crystal comprising a group of crystal grains with an average grain size of 5 μm was obtained.

EXAMPLE 4

By use of a Si substrate having a thermally oxidized film on the surface, a polycrystalline Si thin film was deposited on its surface with a film thickness of 140 nm according to the low pressure CVD method.

On the polycrystalline Si thin film was coated a resist with a film thickness of about 1 μm, and the resist was subjected to patterning according to conventional photolithographic steps so that regions of 2 μm square might remain in lattice spots with 10 μm intervals.

And, after the Si thin film in the region not masked with the resist was subjected to etching of about 40 nm according to the RIE method, the resist was peeled off. By doing so, the region masked with the resist becomes to have a film thickness of 140 nm, while the region subjected to etching a film thickness of 100 nm.

And, the polycrystalline thin film was made amorphous, and further for inhibiting nucleation at the oxidized film interface in thin region, $Si^+$ ions accelerated to an energy of 70 keV were implanted into the whole surface at a dose of $5 \times 10^{15}$ ions.cm$^{-2}$. In this case, since the projected flying distance is 99.7 nm, the ions are positioned approximately at the interface with the oxidized film in the region made thinner by etching, but they will be distributed at the position shallower by about 40 nm than the interface in the region which was left to remain thick as such. Also, the polycrystalline thin film was completely made amorphous over the entire region, including the region which was made thinner as a matter of course and also the thick region.

Accordingly, the film was subjected to heat treatment at a substrate temperature maintained at 600° C. in an $N_2$ atmosphere. Then, after about 15 hours from initiation of the heat treatment, a crystal nucleus began to be generated in the region of 2 μm square with thicker film thickness. At this point, since no nucleation occurred in the surrounding region having a small film thickness, heat treatment was further continued, whereby the crystal nucleus already formed in the region of 2 μm square grew in the lateral direction over that region to become a dendrical thin film crystal of a large grain size. And, when heat treatment was continued for 100 hours, the crystal contacted with the crystal grain grown from the adjoining region about 10 μm apart therefrom to form a grain boundary with the growth end surfaces, and the amorphous Si thin film crystallized over substantially the whole region. As the result, a thin film crystal comprising a group of crystal grains with an average grain size of 10 μm was obtained, while arranging the crystal grain boundaries in lattices with approximately 10 μm intervals.

When transistors were formed by use of the thin film crystals obtained in Examples 3 and 4, transistors having extremely excellent characteristics similarly as the transistors prepared by use of the thin film crystals obtained in Examples 1 and 2 could be formed on the whole substrate surface.

As described above, by utilizing the fact that the crystal nucleation process in an amorphous thin film depends on the film thickness of the thin film, and subjecting the amorphous thin film having regions with different film thicknesses formed within a plane to heat treatment at a temperature not higher than the melting point of the film, a single crystal nucleus is preferentially formed artificially only at a specific position, followed further by solid phase epitaxial growth of it in the lateral direction to the peripherals, or alternatively by utilizing the fact that the crystal nucleation process in an amorphous thin film depends on the projected flying distance of ion-implantation to the thin film, applying ion-implantation into a thin film having regions with different film thicknesses formed within a plane, and then subjecting the film to heat treatment at a temperature not higher than the melting point of the film, a single crystal nucleus is preferentially formed artificially only at a specific position, followed further by solid phase epitaxial growth of it in the lateral direction of them, the present invention provides with thin film formation and a method for formation thereof. And, by doing so, selective nucleation of a single crystal nucleus in the solid phase growth in an amorphous thin film which could not be realized satisfactorily by the method of the prior art can be made possible at high yield and also low cost. As the result, according to the method for forming a thin film crystal according to the present invention, a thin film crystal having a flatness as grown without requiring any step such as polishing, etc., and also comprising a groups of crystalline grains controlled in grain boundary position between adjoining crystal grains and grain sizes can be obtained, and therefore various devices of high performances with little variance of characteristics, etc. between the devices can be formed over a large area, and also such excellent crystalline thin films can be provided.

What is claimed is:

1. A crystal growth method for crystallizing an amorphous thin film, comprising heat-treating an amorphous thin film having a region (I) with a first film thickness and a region (II) with a second film thickness larger than said region (I) and having a sufficiently small area so as to form only a single nucleus from which a single crystal is grown by solid phase growth at a temperature not higher than the melting point of the film.

2. A crystal growth method according to claim 1, wherein said amorphous thin film ion-implanted is formed by patterning.

3. A crystal growth method according to claim 1, wherein the difference between said region (I) with said first film thickness and said region (II) with said second film thickness is from 1 nm to 500 nm.

4. A crystal growth method according to claim 1, wherein the diameter or the length of the shorter side of said region (II) is from 0.1 nm to 5 μm.

5. A crystalline article obtained by the crystal growth method according to claim 1.

6. A crystal growth method for crystallizing an amorphous thin film, comprising:
  implanting ions into an amorphous thin film having a region (I) with a first film thickness and a region (II) with a second film thickness larger than said region (I) and having a sufficiently small area so as to form only a single nucleus from which a single crystal is grown by solid phase growth, and
  heat-treating the ion-implanted amorphous thin film at a temperature not higher than the melting point of the film.

7. A crystal growth method according to claim 6, wherein the difference between said region (I) with said first film thickness and said region (II) with said second film thickness is from 1 nm to 500 nm.

8. A crystal growth method according to claim 6, wherein the diameter or the length of the shorter side of said region (II) is from 0.1 nm to 5 μm.

9. A crystalline article obtained by the crystal growth method according to claim 6.

10. A crystal growth method according to claim 1 or 6, wherein the interval between each center of said region (II) is 100 μm or less.

11. A crystal growth method according to claim 1 or 6, wherein the temperature of said heat treatment is in a range of 0.25 Tm to 0.8 Tm.

12. A crystal growth method according to claim 1 or 6, wherein said amorphous thin film is a semiconductor or a metal.

13. A crystal growth method according to claim 12, wherein said semiconductor is selected from Si, Ge, GaAs or InP.

14. A crystal growth method according to claim 12, wherein said metal is selected from Al or Mo.

15. A crystal growth method according to claim 1 or 6, wherein said amorphous thin film is provided on a subbing material.

16. A crystal growth method according to claim 15, wherein said subbing material is a non-monocrystalline insulating material.

17. A crystal growth method according to claim 15, wherein said subbing material is selected from $SiO_2$, $Si_2N_4$ or $Al_2O_2$.

* * * * *

UNITED STATES PATENT AND TRADEMARK OFFICE
CERTIFICATE OF CORRECTION

PATENT NO. : 5,207,863
DATED : May 4, 1993
INVENTOR(S) : HIDEYA KUMOMI

Page 1 of 2

It is certified that error appears in the above-identified patent and that said Letters Patent is hereby corrected as shown below:

COLUMN 1

Line 35, "(Elaevier" should read --(Elsevier--.

COLUMN 4

Line 55, "creased" should read --creasing--.
Line 60, "independent" should read --are independent--.

COLUMN 5

Line 5, "off" should read --of--.

COLUMN 7

Line 26, "making" should read --make--.
Line 40, "suitable" should read --suitably--.

COLUMN 8

Line 25, "all" should read --whole--.
Line 56, "$N^2$ atomosphere." should read --$N_2$ atmosphere.--.

COLUMN 9

Line 8, "When," should read --When--.
Line 61, "all" should read --whole--.

UNITED STATES PATENT AND TRADEMARK OFFICE
CERTIFICATE OF CORRECTION

PATENT NO. : 5,207,863
DATED : May 4, 1993
INVENTOR(S) : HIDEYA KUMOMI

It is certified that error appears in the above-identified patent and that said Letters Patent is hereby corrected as shown below:

<u>COLUMN 11</u>

Line 17,. "groups" should read --group--.

Signed and Sealed this

Twenty-sixth Day of April, 1994

BRUCE LEHMAN

*Attest:*

*Attesting Officer*  *Commissioner of Patents and Trademarks*